(12) United States Patent
Pioppo

(10) Patent No.: US 6,269,388 B1
(45) Date of Patent: Jul. 31, 2001

(54) CIRCUIT FOR GENERATING A TRAPEZOIDAL SIGNAL WITH CONTROLLED WAVEFRONTS, PARTICULARLY FOR A CONVERTER OF SATELLITE RECEIVER

(75) Inventor: Sergio Pioppo, Mascalucia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/248,400

(22) Filed: Feb. 10, 1999

(30) Foreign Application Priority Data

Feb. 11, 1998 (IT) .............................................. MI98A0263

(51) Int. Cl.[7] ...................................................... G06G 7/22
(52) U.S. Cl. .............................................................. 708/852
(58) Field of Search ................................... 708/852, 276; 327/130–131

(56) References Cited

U.S. PATENT DOCUMENTS

| | | | |
|---|---|---|---|
| 4,016,496 | * 4/1977 | Eastcott | 708/852 |
| 4,064,406 | * 12/1977 | Tiemeijer | 708/852 |
| 4,514,820 | * 4/1985 | Mirow et al. | 708/852 |
| 4,563,548 | * 1/1986 | Misherghi et al. | 708/276 |
| 4,672,568 | * 6/1987 | Taylor | 708/276 |

* cited by examiner

Primary Examiner—Tan V. Mai
(74) Attorney, Agent, or Firm—Theodore E. Galanthay; Robert Iannucci; Seed IP Law Group, PLLC

(57) ABSTRACT

Embodiments of the invention provide a circuit for generating a trapezoidal signal with controlled wavefronts, particularly for a converter for a satellite receiver, comprising a first oscillator suitable to generate a square-wave signal and a second oscillator which is cascade-connected to the first oscillator, wherein the second oscillator is synchronized with the first oscillator and is suitable to generate a voltage signal which is amplitude-modulated with a trapezoidal modulating signal.

20 Claims, 2 Drawing Sheets

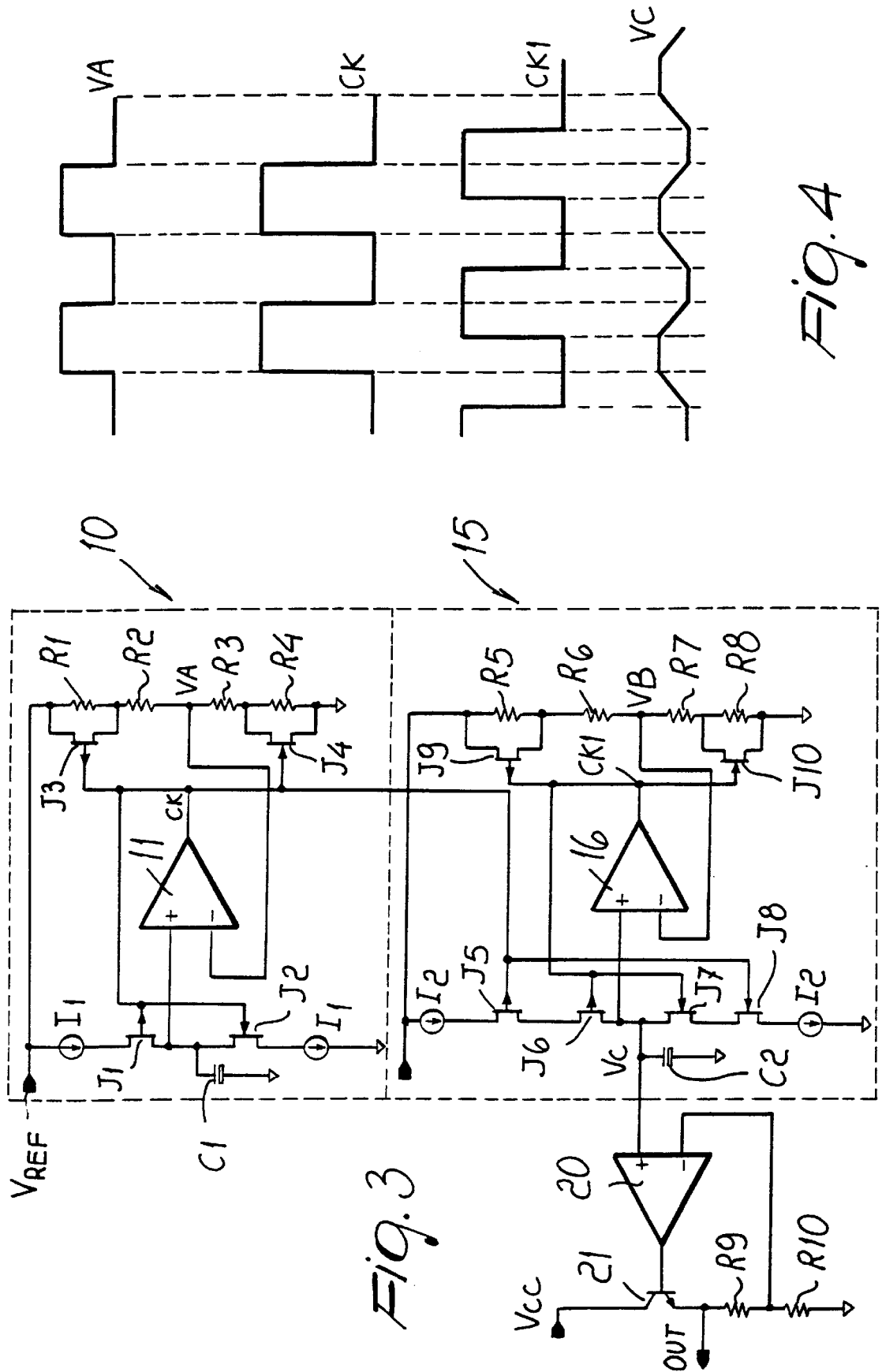

CIRCUIT FOR GENERATING A TRAPEZOIDAL SIGNAL WITH CONTROLLED WAVEFRONTS, PARTICULARLY FOR A CONVERTER OF SATELLITE RECEIVER

TECHNICAL FIELD

The present invention relates to a circuit for generating a trapezoidal signal with controlled wavefronts, particularly for a converter of a satellite receiver.

More particularly, the invention relates to a circuit for generating a trapezoidal signal which is used as a regulated amplitude-modulated supply voltage for a satellite receiver.

BACKGROUND OF THE INVENTION

It is known that a converter for a satellite receiver, commonly referred to as an "LNB," is supplied by a device that also performs logic control of the LNB.

In particular, such a device, sometimes referred to as an "LNBP," is a dual-output voltage supply having a regulated output voltage that can be amplitude-modulated by means of a trapezoidal signal generated in the device itself. The modulating signal is detected by the satellite receiver for band control.

The modulating signal should have characteristics, in terms of frequency, duty cycle, rise and fall times, which comply with standards used by many satellite receiver manufacturers.

A difficult problem to solve is controlling rise and fall times of the modulating signal, which have an upper limit and a lower limit. The lower limit is required because very fast wavefronts, generated by high-frequency harmonics, can compromise satellite signal reception quality.

The upper limit is instead necessary because very slow wavefronts are comparable with the period of the modulating signal and would, therefore, compromise recognition of the modulating signal by the satellite receiver.

The problem is currently addressed by using discrete components, such as by using a square-wave oscillator followed by a low-pass RC filter. This device powers and controls the satellite receiver by means of a coaxial cable. Control of a reception band of the satellite receiver is performed by means of a square-wave signal with controlled fronts.

FIG. 1 illustrates a square-wave oscillator 1 followed by a low-pass pass RC filter 2. In this manner, a square-wave signal from the oscillator is filtered by the RC filter 2, whose output signal is a trapezoidal waveform signal having an amplitude equal to an amplitude of the square-wave signal generated by the oscillator 1.

The trapezoidal output signal is added to a reference voltage so that the output of the device is amplitude-modulated with a preset peak-to-peak amplitude of the modulating signal. The sum of the trapezoidal waveform signal and the reference voltage is provided by the OR gate 3. The output of the OR gate 3 is sent to an operational amplifier 20 having a transistor 21 connected to an output thereto.

This technique has inaccuracies and has a drawback of having little correlation between the frequency of the modulating signal and the rise and fall times of the modulating signal. In particular, there is no link between the frequency of the square wave and the rise and fall times. In this manner, it is possible to have a high frequency and long-lasting fronts, thereby leading to problems in recognizing the signal.

Accordingly, this system requires dual trimming of the capacitances of the oscillator 1 and of the RC filter 2. Furthermore, the above-described system provides low precision in the amplitude of the modulating signal, and further entails a need to normalize the amplitude of the modulating signal with respect to the reference voltage, such that the amplitude of the modulated output is preset.

SUMMARY OF THE INVENTION

An advantage of the present invention is to provide a circuit for generating a trapezoidal signal with controlled wavefronts, such as for a converter for a satellite receiver, which provides a correspondence between the oscillation frequency and the rise and fall times of the wavefronts without using external components.

Another advantage of the present invention is to provide a circuit for generating a trapezoidal signal with controlled wavefronts, such as for a converter for a satellite receiver, in which an output signal can be precisely amplitude-modulated.

Another advantage of the present invention is to provide a circuit for generating a trapezoidal signal with controlled wavefronts, such as for a converter for a satellite receiver, in which a square-wave signal can have precisely controlled rising and falling fronts.

Another advantage of the present invention is to provide a circuit for generating a trapezoidal signal with controlled wavefronts, such as for a converter for a satellite receiver, which can be highly reliable and relatively easy to manufacture at competitive costs.

Embodiments of the invention provide a circuit for generating a trapezoidal signal with controlled wavefronts, such as for a converter for a satellite receiver, the circuit comprising a first oscillator to generate a square-wave signal and a second oscillator cascade-connected to the first oscillator, wherein the second oscillator is synchronized with said first oscillator and is suitable to generate a voltage signal which is amplitude-modulated with a trapezoidal modulating signal.

BRIEF DESCRIPTION OF THE DRAWINGS

Further characteristics and advantages of the present invention will become apparent from the following detailed description of a preferred, but not exclusive, embodiment of a circuit according to the invention, illustrated by way of a non-limiting example in the accompanying drawings.

FIG. 3 is a detailed circuit diagram of a circuit according to an embodiment of the present invention.

FIG. 4 is a timing chart of signals of a circuit according to an embodiment of the present invention.

In the drawings, like reference numerals refer to like parts throughout the various views unless otherwise specified.

DETAILED DESCRIPTION OF THE ILLUSTRATED EMBODIMENTS

Figure 1:
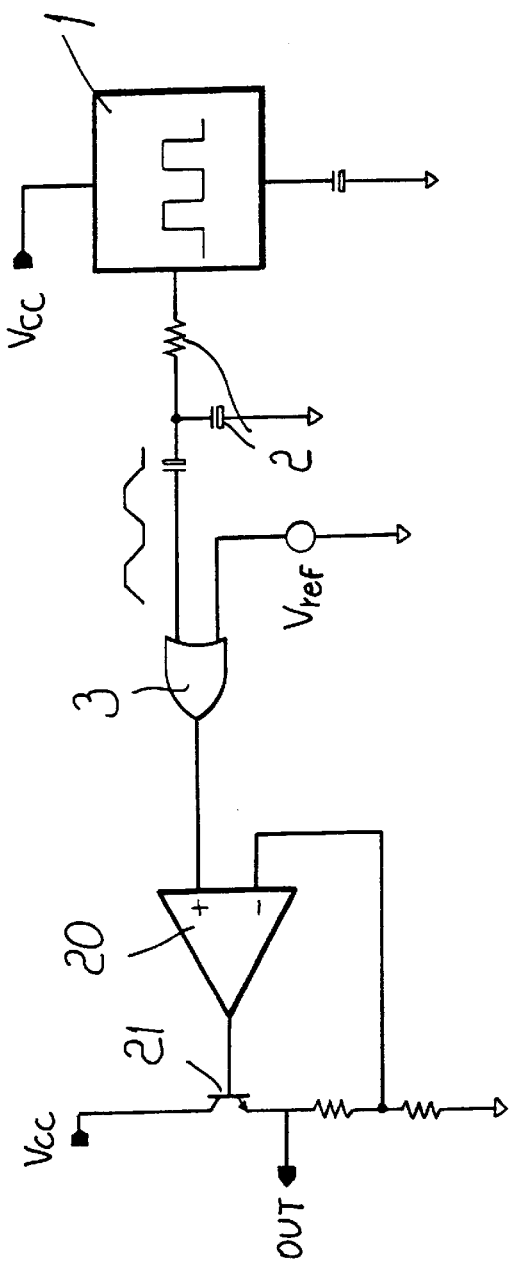
FIG. 1 is a block diagram of a conventional circuit.
Figure 2:
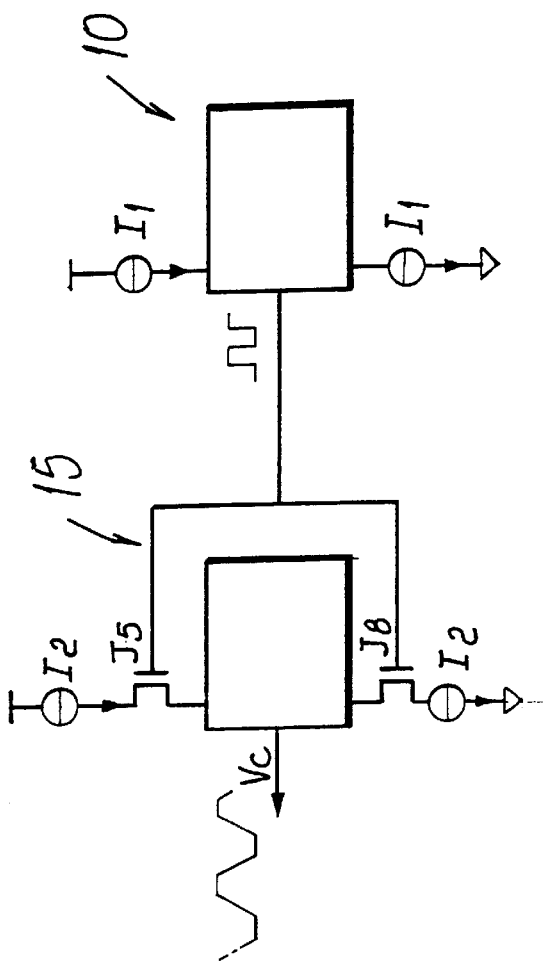
FIG. 2 is a block diagram of a circuit according to an embodiment of the present invention.

With reference to FIG. 2, a circuit according to the present invention comprises a first oscillator 10, which is suitable to generate a square-wave signal and is connected to and synchronized with a second oscillator 15 which is suitable to generate a voltage signal which is amplitude-modulated with a trapezoidal modulating signal.

Referring next to FIG. 3, the first oscillator 10 includes an operational amplifier 11, a constant-current source I1, a capacitor C1, a resistive divider comprising of resistors R1, R2 and R3, P-channel transistors J1 and J3, and N-channel transistors J2 and J4.

The first oscillator 10 generates a square-wave signal CK, whose waveform is shown in FIG. 4, at a preset frequency.

In particular, the transistors J1 and J2, of the P-channel and N-channel types respectively, are connected between a reference voltage Vref and ground, and their respective gate terminals are connected to an output of the operational amplifier 11 and to gates of the transistors J3 and J4, which in turn are parallel-connected to the resistors R1 and R4, respectively. The resistors R1 and R4 are mutually identical.

Drain terminals of the transistors J1 and J2 are connected to a noninverting input of the operational amplifier 11, while an inverting input of the operational amplifier 11 is connected to a common point between drain terminals of the transistors J3 and J4. Gates of the transistors J3 and J4 are connected to gates of transistors J5 and J8 belonging to the second oscillator 15.

The oscillator 15 comprises an operational amplifier 16, which is connected between a first circuit branch and a second circuit branch. The first circuit branch comprises four transistors J5–J8 which are connected between the reference voltage Vref and ground, with current sources 12. The transistors J5 and J6 are of the P-channel type, while the transistors J7 and J8 are of the N-channel type.

Gate terminals of the transistors J6 and J7 are connected to gate terminals of transistors J9 and J10, of the P-channel and N-channel types respectively, which belong to the second circuit branch of the second oscillator 15.

The transistors J9 and J10 have resistors R5 and R8, respectively, parallel-connected thereto, and resistors R6 and R7 are interposed between drain terminals of the transistors J9 and J10. The resistors R5 and R8 are mutually identical.

An output of the operational amplifier 16 of the second oscillator 15 is connected to gate terminals of the transistors J9 and J10.

A noninverting input of the operational amplifier 16 is connected to a common point between drain terminals of the transistors J6 and J7, while an inverting input of the operational amplifier 16 is connected to a common point between the resistors R6 and R7.

The output of the operational amplifier 16 is designated by the reference CK1, whose waveform is shown in FIG. 4.

The common point of the drain terminals of the transistors J6 and J7 is designated by VC and provides an output trapezoidal-wave signal shown in FIG. 4. The trapezoidal signal VC is sent to a noninverting input of an operational amplifier 20, at whose output there is provided a bipolar transistor 21 which is connected between a supply voltage Vcc and ground.

An inverting input of the operational amplifier 20 is connected to an intermediate point between two resistors R9 and R10 forming a resistive divider, which are series-connected to the emitter terminal of the transistor 21. An output voltage of the circuit is taken at the emitter terminal of the transistor 21 and is used to supply and control, for example, an LNB converter for a satellite receiver.

The operational stage 20, together with the transistor 21 and the resistive divider R9 and R10, adjusts the output voltage of the device in which the circuit according to the present invention is used.

The operation of the circuit is now described with reference to FIGS. 3 and 4. The first oscillator 10 generates a square wave whose period T1 is determined by the relation:

$$T1=2*C1*\Delta V1/I1 \tag{1}$$

where $$\Delta V1 = Vref*(R1+R3)/RT1 - Vref*R3/RT1 = Vref*R1/RT1$$

where $$RT1 = R1+R2+R3$$

The above relation is obtained by considering that when the voltage across the capacitor C1, which is charged at a constant current I1, reaches a value VAmax=Vref*(R1+R3)/RT1, the output of the operational amplifier 11 passes from a low state to a high state, varying both the value of the feedback voltage VAmin=Vref*R3/R1, by opening the P-channel transistor J3 and closing the N-channel transistor J4, and by discharging the capacitor C1, again at a constant current I1, by opening the P-channel transistor J1 and closing the N-channel transistor J2.

The charging and discharging of the capacitor C1 is repeated cyclically, so that the output of the operational amplifier 11 is a square wave CK with an amplitude Vref, a 50% duty cycle, and a frequency which is given by $$f1=I1/(2*C1*\Delta V1)=I1*RT1/(2*C1*Vref*R1)$$

The signal CK is sent to the second oscillator 15, which synchronizes charging and discharging of the capacitor C2 with the signal CK by means of the transistors J5 and J8.

As shown by the block diagram of FIG. 2 and by the corresponding timing shown in FIGS. 3 and 4, charging and discharging of the capacitor C2 can occur only when the output CK1 of the operational amplifier 16 is in phase with the signal CK.

Charging and discharging times of the capacitor C2 are regulated by the following relations:

$$tr=tf=C2*\Delta V2/I2,$$

where $$\Delta V2=Vref*R5/RT2 \tag{2}$$

and $$RT2=R5+R6+R7$$

and therefore, $$tr=tf=C2*Vref*R5/(I2*RT2) \tag{3}$$

Accordingly, the trapezoidal signal VC has a frequency equal to f1 and rise and fall times determined by the relation designated by (3). Moreover, the amplitude of the modulating signal is obtained from relation (2), while the average value of the trapezoidal signal VC is obtained from the following relation:

$$VCave=(VCmax+VCmin)/2=Vref*(R5/2+R7)/RT2.$$

The ratio between the period of CK and the rise and fall times is equal to:

$$T1/tr=2*C1*R1*Vref*I2*RT2/((I1*RT1*C2*Vref*R5)T1/tr=2*C1*R1*RT2*I2/(I1*RT1*R5*C2)$$

because I1 and I2 originate from the same current source I. In practice, I1=K1 and I2=K2*I, where K1 and K2 are transistor area ratios, and therefore:

$$T1/tr=2*C1*R1*RT2*K2/(C2*RT1*R5*K1)$$

This ratio depends only on the matching among circuit components, and accordingly its variation is minimal if there are process variations.

By adjusting only the current I, it is also possible to obtain an adjustment of the period and of the wavefronts of the trapezoidal signal VC.

The trapezoidal signal VC is then sent to the noninverting input of the operational amplifier 20. An output signal Vout is thus obtained which is given by:

$$Vout=K*VC$$

where $$K=(R9+R10)/R10$$

The advantages of this solution can be summarized as follows:

A slew rate of the trapezoidal voltage VC is controlled and defined by relation (3). It is evident that it depends on very precise parameters which can be varied easily, making the circuit suitable for many applications.

Moreover, a link between the oscillation frequency and the slew rate of the trapezoidal signal VC depends only on the matching of circuit parameters, and therefore, as a first approximation, it can be considered independent of the process.

Also, with a single adjustment of the bias current I, it is possible to increase the precision of the frequency and of the slew rate of the trapezoidal signal VC.

The above-described circuit has been implemented in BCD technology, and as mentioned above, is used, for example, in a satellite receiver supply and control device. The circuit can be applied to other devices in which it is important to have a supply voltage with a trapezoidal waveform with controlled wavefronts.

The circuit thus conceived is susceptible of numerous modifications and variations, all of which are within the scope of the inventive concept. All the details may also be replaced with other technically equivalent elements. The disclosure in Italian Patent Application No. MI98A000263, filed Feb. 11, 1998, from which this application claims priority are incorporated herein by reference.

In general, in the following claims, the terms should not be construed to limit the invention to the specific embodiments disclosed in the specification and in the claims. Accordingly, the invention is not limited by the disclosure, but instead the scope of the invention is to be determined entirely by the following claims.

What is claimed is:

1. A circuit for generating a trapezoidal signal with controlled wavefronts for a converter for a satellite receiver, the circuit comprising:
   a first oscillator to generate a square-wave signal; and
   a second oscillator cascade-connected to the first oscillator, wherein the second oscillator is synchronized with said first oscillator and generates a voltage signal amplitude modulated with a trapezoidal modulating signal.

2. The circuit according to claim 1 wherein said first oscillator is identical to said second oscillator and is connected to gate terminals of a pair of transistors which are interposed respectively between said second oscillator and a reference voltage and said second oscillator and ground.

3. The circuit according to claim 1 wherein said trapezoidal signal has wavefronts and wherein said wavefronts are controlled in a closed loop.

4. The circuit according to claim 1 wherein said first oscillator comprises a first operational amplifier having an output connected to a first circuit branch of said second oscillator.

5. The circuit according to claim 4 wherein said second oscillator comprises a second operational amplifier having an output connected to a second circuit branch of said second oscillator, and wherein an inverting terminal of said second operational amplifier is connected to said second circuit branch.

6. The circuit according to claim 4 wherein an output of said first operational amplifier is connected to gate terminals of a first pair of transistors and of a second pair of transistors, each pair of transistors comprising transistors of different conductivity types belonging to the first circuit branch and to a second circuit branch of said first oscillator.

7. The circuit according to claim 6, further comprising:
   resistors parallel-connected to transistor of said second pair, wherein said transistors are connected between a reference voltage and ground; and
   a further pair of resistors series-connected between the transistors of said second pair.

8. The circuit according to claim 7 wherein an inverting terminal of said first operational amplifier is connected between resistors of said further pair of resistors.

9. The circuit according to claim 6, further comprising a first capacitor connected between transistors of said first pair of transistors and ground.

10. The circuit according to claim 4 wherein said first circuit branch of said second oscillator comprises four transistors having different conductivity types in pairs and connected between a reference voltage and ground.

11. The circuit according to claim 10 wherein gate terminals of a first pair of said four transistors are connected to the output of said first operational amplifier, wherein gate terminals of a second pair of said four transistors are connected to an output of a second operational amplifier and to a gate terminals of transistors of a second circuit branch of said second oscillator.

12. The circuit according to claim 11 wherein the transistors of the second circuit branch of said second oscillator are parallel-connected to respective resistors, and further comprising a further pair of resistors connected between the transistors of said second circuit branch, wherein an inverting terminal of said second operational amplifier is connected between resistors of said further pair of resistors.

13. The circuit according to claim 11, further comprising a second capacitor connected between transistors of said second pair of transistors of the first circuit branch of the second oscillator and ground.

14. A device for supplying and controlling a converter for a satellite receiver, comprising first and second mutually connected and synchronized oscillators to generate a trapezoidal signal having wavefronts, wherein the wavefronts are controlled in a closed loop, and wherein said trapezoidal signal is sent to a voltage regulator.

15. The device of claim 14 wherein the first and second oscillators comprise respective first and second operational amplifiers, wherein each operational amplifier has an output connected to gates of two pairs of transistors, wherein transistors in each pair have different conductivity types.

16. The device of claim 14, further comprising first and second capacitors, wherein the first and second capacitors are each connected between ground and common points joining transistor pairs of different conductivity types, wherein the transistor pairs are parts of the first and second oscillators.

17. A method of generating a trapezoidal signal having controlled wavefronts, the method comprising:
- connecting an output of a first oscillator to a second oscillator;
- using the first oscillator to generate a square-wave signal;
- sending the square-wave signal generated by the first oscillator to the second oscillator through the output;
- synchronizing a charging and discharging of a capacitor in the second oscillator based on the sent square-wave signal generated by the first oscillator; and
- obtaining the trapezoidal signal from the charging and discharging of the capacitor.

18. The method of claim 17, further comprising:
- providing a constant current source to the first and second oscillators; and
- varying the current source to adjust a period or the wavefronts of the trapezoidal signal.

19. The method of claim 17 wherein the connecting the output of the first oscillator to the second oscillator comprises:
- providing a first operational amplifier in the first oscillator;
- connecting an output of the first operational amplifier to a pair of transistors of different conductivity types; and
- connecting the capacitor between a common point joining the pair of transistors and ground.

20. The method of claim 17, further comprising:
- sending the trapezoidal signal to a non-inverting terminal of an operational amplifier; and
- taking an output signal from transistor connected to an output of the operational amplifier, wherein the output signal is the trapezoidal signal multiplied by a constant.

* * * * *